United States Patent
Eberler et al.

(10) Patent No.: US 8,108,026 B2
(45) Date of Patent: Jan. 31, 2012

(54) DEVICE CONSISTING OF A COMBINATION OF A MAGNETIC RESONANCE TOMOGRAPH AND A POSITRON EMISSION TOMOGRAPH

(75) Inventors: Michael Eberler, Postbauer-Heng (DE); Jürgen Nistler, Erlangen (DE); Wolfgang Renz, Erlangen (DE); Günther Zebelein, Möhrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 958 days.

(21) Appl. No.: 12/081,560

(22) Filed: Apr. 17, 2008

(65) Prior Publication Data
US 2008/0267478 A1    Oct. 30, 2008

(30) Foreign Application Priority Data

Apr. 24, 2007 (DE) .................. 10 2007 019 326

(51) Int. Cl.
*A61B 5/05* (2006.01)
(52) U.S. Cl. ........ 600/411; 600/407; 600/410; 600/425; 600/427; 600/436; 250/363.01; 250/363.02; 250/363.03; 250/363.04; 250/363.05; 324/318
(58) Field of Classification Search .................. 600/407, 600/410, 411, 425, 427, 436; 250/363.01, 250/363.02, 363.03, 363.04, 363.05; 324/318
See application file for complete search history.

(56) References Cited

U.S. PATENT DOCUMENTS

| 2002/0148966 A1* | 10/2002 | Juni ....................... 250/363.04 |
| 2005/0059877 A1* | 3/2005 | Falbo, Sr. ...................... 600/407 |
| 2006/0251312 A1* | 11/2006 | Krieg et al. .................... 382/131 |
| 2007/0102641 A1 | 5/2007 | Schmand et al. |
| 2008/0068017 A1 | 3/2008 | Eberler et al. |

FOREIGN PATENT DOCUMENTS

DE    102006037047 A1    2/2008

OTHER PUBLICATIONS

Grazioso R. et al., "APD-based PET detector for simultaneous PET/MR imaging" Nuclear Instruments and Methods in Physics Research A., ISSN 0168-9002.2006, vol. 569, S.301-305; Others.

* cited by examiner

*Primary Examiner* — Tse Chen
*Assistant Examiner* — Jason Ip
(74) *Attorney, Agent, or Firm* — Harness, Dickey & Pierce, P.L.C.

(57) ABSTRACT

A sandwich structure which attenuates the PET radiation minimally, is used as a support tube for the transmit antenna. In at least one embodiment, it includes a thin strong inner wall, a likewise thin and strong outer wall and an interior of the support tube which is of the honeycomb type or is made of foam material.

8 Claims, 3 Drawing Sheets

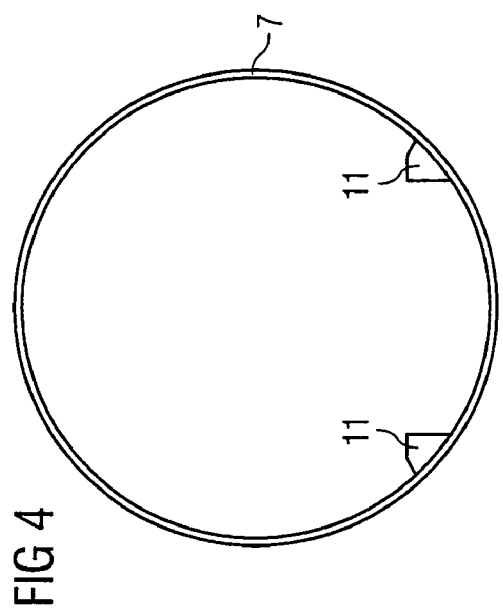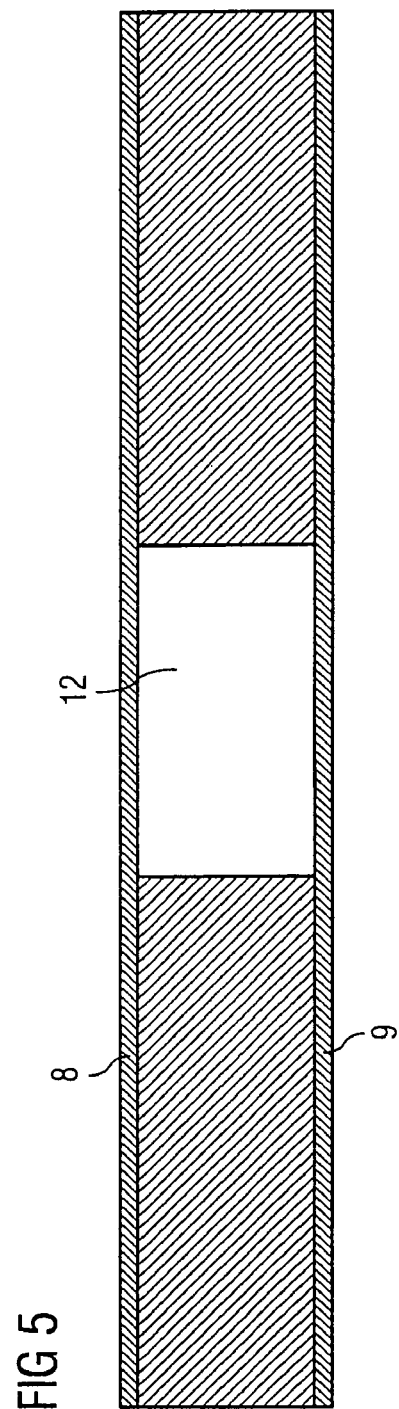

DEVICE CONSISTING OF A COMBINATION OF A MAGNETIC RESONANCE TOMOGRAPH AND A POSITRON EMISSION TOMOGRAPH

PRIORITY STATEMENT

The present application hereby claims priority under 35 U.S.C. §119 on German patent application number DE 10 2007 019 326.4 filed Apr. 24, 2007, the entire contents of which is hereby incorporated herein by reference.

FIELD

Embodiments of the present invention generally relate to a device including a combination of a magnetic resonance tomograph and a positron emission tomograph.

BACKGROUND

In order to combine the imaging methods of magnetic resonance tomography (MR) and positron emission tomography (PET) in one machine, both the MR RF transmit-receive system and the PET detectors must be arranged inside the primary magnet and the MR gradient coil. However, arranging the RF system inside the PET ring presents the crucial disadvantage that the support structures and the cladding tube of the internally lying transmit and receive coils reduce the sensitivity of the PET detectors. A tube made of epoxy resins reinforced with glass fibers, or similar encapsulation materials which strongly attenuate the PET radiation owing to their high material density, is generally used as a support structure for the RF transmit antenna and at the same time sometimes also serves as cladding.

SUMMARY

In at least one embodiment of the invention, a device is provided in which a strong attenuation of the PET radiation is avoided.

The device according to at least one embodiment of the invention ensures a number of considerable advantages. In at least one embodiment, it obviates the attenuation of the gamma radiation due to the support structures arranged inside the PET ring. The PET scan time can also be minimized, and a higher PET S/N is possible. In particular, at least one embodiment of the invention permits simultaneous PET and MR imaging and therefore faster scanning of a patient. Lastly, the greater thermal insulation of the antenna structure from the interior is also advantageous.

In at least one embodiment, a sandwich structure including three layers, i.e. thin inner and outer walls as well as a central layer lying between them, is advantageous. The outer and inner walls preferably include thin layers with high rigidity, while the central layer contains a filler material which transmits PET rays well. As an alternative, in at least one embodiment, it is also possible to use a composite material consisting of only two layers, or one including four, five or more layers. In particular, a two-layer structure including a thin rigid outer wall and a positron-transmissive geometrically stable inner wall may be used.

BRIEF DESCRIPTION OF THE DRAWINGS

Example embodiments of the invention are represented in the appended figures.

FIG. 4 shows a cross section through another example embodiment of a support tube designed according to the invention;

FIG. 5 shows a longitudinal section through the support tube represented in FIG. 4, on an enlarged scale.

DETAILED DESCRIPTION OF THE EXAMPLE EMBODIMENTS

Figure 1:
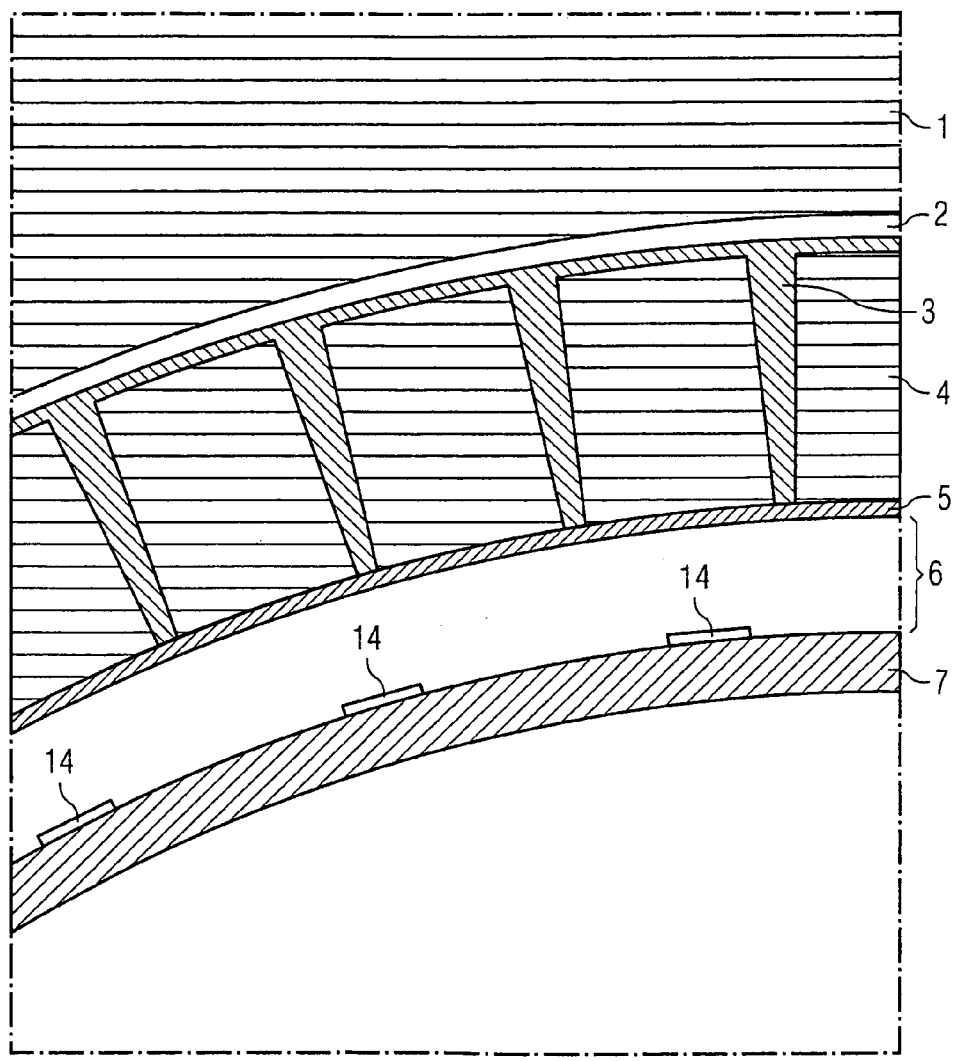
FIG. 1 shows a detail of a cross section through an example embodiment of a device according to the invention.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

The detail of a device according to an embodiment of the invention as represented in FIG. 1 shows a gradient coil 1 which is arranged on a support tube 3 for the PET detectors 4 while being separated from it by an assembly gap 2. Avalanche photodiodes, which unlike photomultipliers can be used as sensor elements inside a magnetic field, are used as PET detectors 4. A support tube 7 designed according to an embodiment of the invention is used as a support for the transmit antenna. The transmit antenna 14 is fastened, for example adhesively bonded, in the form of thin copper layers 14 on the outer side of the support tube. The field return flux space 6 of the transmit antenna is provided above it and separated from the PET detectors 4 by a radiofrequency shield 5.

Figure 2:
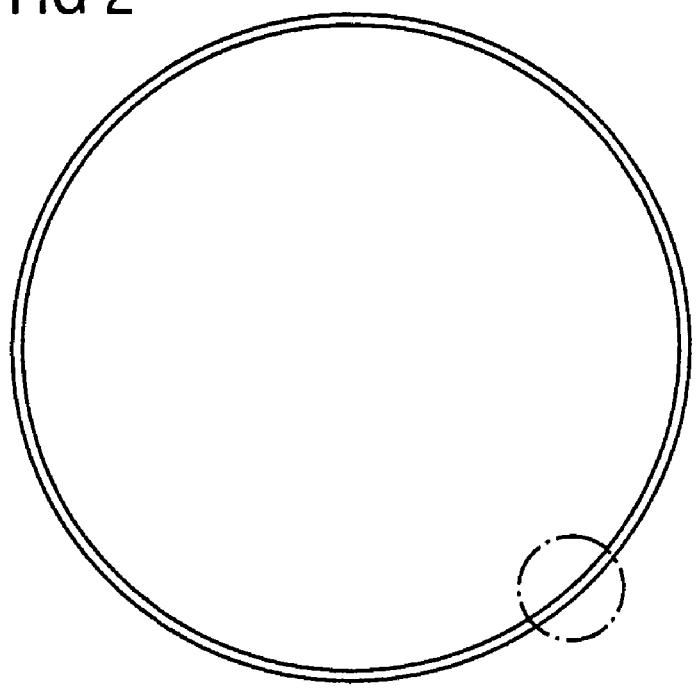
FIG. 2 shows a cross section through a support tube of a device according to a first embodiment.
Figure 3:
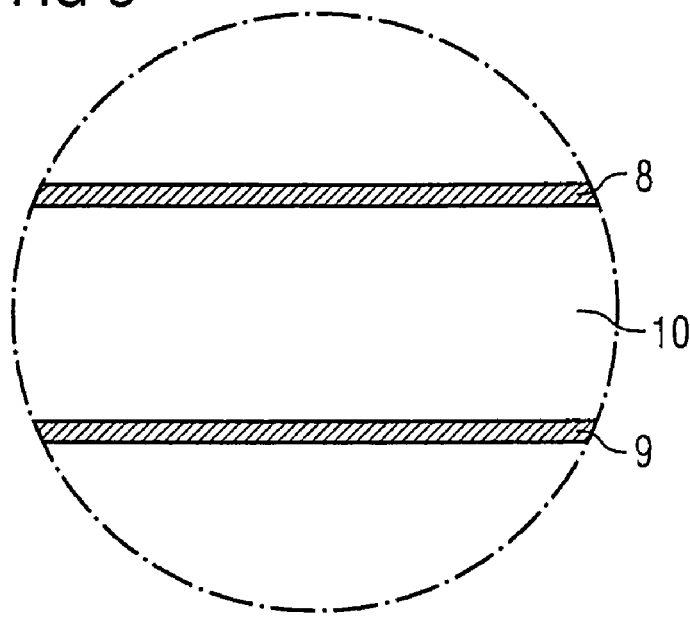
FIG. 3 shows a greatly enlarged detail of the support tube represented in FIG. 2.

FIG. 3 shows a detail of the support tube 7 represented in FIG. 2. It is constructed from a thin inner wall 8 with high rigidity and a likewise very rigid outer wall 9, between which a pressure-resistant central layer 10 of the support tube 7 for the transmit antenna is arranged. The thin inner wall 8 and the thin outer wall 9 may include plastic, epoxy resin, in particular glass fiber-reinforced epoxy resin, Plexiglas®, glass. Their thickness is preferably selected in the range of between 0.2 and 2 mm, preferably 0.5 and 1 mm, particularly preferably 0.75 mm. In particular a foam material, for example polyurethane foam or Rohacell®, is suitable for the interior 10 of the support tube 7. Honeycomb-like structures made of paper may also be used. For 10 mm total thickness of the support tube 7, the lightweight interior 10 should constitute about 70% to 90%, preferably 80% of the total thickness. This leads to a sandwich structure which entails only very minor attenuation of the PET radiation. It combines a high rigidity in the circumferential direction of the support tube 7 with little bending and deformation. The thin inner wall 8 and the likewise thin outer wall 9 prevent damage to the lightweight interior 10 of the support tube 7.

In the example embodiment of the invention as represented in FIGS. 4 and 5, the support tube 7 also fulfils the function of carrying the rails 11 for the patient table. In this example embodiment, an interlayer 12 which includes a foam material or a honeycomb-type material is used only in the vicinity of the PET detectors 4, as revealed by the representation of a longitudinal section in FIG. 5. A material with greater rigidity, for example glass fiber-reinforced epoxy resin, may be used outside the region of the PET detectors 4. Using the interlayer 12 in the vicinity of the PET detectors still ensures the desired low attenuation, while at the same time the rigidity of the support tube is increased.

Further, elements and/or features of different example embodiments may be combined with each other and/or substituted for each other within the scope of this disclosure and appended claims.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A device, comprising:
   a magnetic resonance (MR) tomograph;
   a positron emission tomograph (PET), an MR radio frequency (RF) transmit-receive system and a PET detector being arranged inside a magnet and a gradient coil of the MR tomograph; and
   a support tube for the MR RF transmit-receive system, the support tube being configured to insubstantially attenuate PET radiation,
   wherein the support tube includes a sandwich structure that has an outer wall and an inner wall which are made of thin layers with high rigidity, respectively, the sandwich structure further including a central layer made of a material configured to resist an applied pressure.

2. The device as claimed in claim 1, wherein a thicknesses of the outer wall and a thickness of the inner wall are 0.5-1.0 mm.

3. The device as claimed in claim 1, wherein the central layer of the support tube includes foam material.

4. The device as claimed in claim 1, wherein the central layer of the support tube includes honeycomb-type material.

5. The device as claimed in claim 1, wherein an interior of the support tube, between the outer wall and the inner wall, is filled with an interlayer of at least one of a foam material and honeycomb-type material only in a vicinity of the PET detectors, while a remainder of the interior is filled with a material different than the interlayer.

6. The device as claimed in claim 2, wherein the central layer of the support tube includes foam material.

7. The device as claimed in claim 2, wherein the central layer of the support tube includes honeycomb-type material.

8. The device as claimed in claim 2, wherein an interior of the support tube, between the outer wall and the inner wall, is filled with an interlayer of at least one of a foam material and honeycomb-type material only in a vicinity of the PET detectors, while a remainder of the interior is filled with a material different than the interlayer.

* * * * *